United States Patent [19]
Canaris

[11] Patent Number: 5,418,473
[45] Date of Patent: May 23, 1995

[54] SINGLE EVENT UPSET IMMUNE LOGIC FAMILY

[75] Inventor: John Canaris, Albequerque, N. Mex.

[73] Assignee: Idaho Research Foundation, Inc., Moscow, Id.

[21] Appl. No.: 967,457

[22] Filed: Oct. 28, 1992

[51] Int. Cl.$^6$ ............................................. H03K 17/16
[52] U.S. Cl. ...................................... 326/27; 326/121; 327/208
[58] Field of Search .................. 307/44 B, 451, 296.5, 307/272.2, 279

[56] References Cited

U.S. PATENT DOCUMENTS

| | | | |
|---|---|---|---|
| 4,532,439 | 7/1985 | Koike | 307/450 |
| 4,575,648 | 3/1986 | Lee | 307/451 |
| 4,782,467 | 11/1988 | Belt et al. | 365/154 |
| 4,785,200 | 11/1988 | Huntington | 307/279 |
| 4,805,148 | 2/1989 | Diehl-Nagle et al. | 365/154 |
| 4,820,942 | 4/1989 | Chan | 307/542 |
| 4,833,347 | 5/1989 | Rabe | 307/443 |
| 4,908,528 | 3/1990 | Huang | 307/443 |
| 4,937,473 | 6/1990 | Statz et al. | 307/443 |
| 4,940,905 | 7/1990 | Kobayashi et al. | 307/278 |
| 5,034,629 | 7/1991 | Kinugasa | 307/443 |
| 5,039,876 | 8/1991 | Hochwald et al. | 307/278 |
| 5,043,939 | 8/1991 | Slamowitz et al. | 365/154 |
| 5,130,581 | 7/1992 | Oh et al. | 307/279 |

OTHER PUBLICATIONS

L. Rocket, "An SEU Hardened CMOS Data Latch Design", IEEE Transactions on Nuclear Science, vol. 35, No. 6, pp. 1682–1687, Dec. 1988.

S. E. Diehl, J. E. Vinson, B. D. Shafer and T. M. Mnich, "Considerations For Single Event Immune VLSI Logic", IEEE Transactions on Nuclear Science, vol. NS–30, No. 6, pp. 4501–4507, Dec. 1983.

J. F. Leavy, L. F. Hoffman, R. W. Shovan and M. T. Johnson, "Upset Due to a Single Particle Caused Propagated Transient in a Bulk CMOS Microprocessor", IEEE Transactions on Nuclear Science, vol. 38, No. 6, pp. 1493–1499, Dec. 1991.

Y. Savaria, J. F. Hayes, N. C. Rumin and V. K. Agarwal, "A Theory for the Design of Soft-Error-Tolerant VLSI Circuits", IEEE Journal on Selected Areas in Communications, vol. SAC–4, No. 1, pp. 15–23, Jan. 1986.

Y. Savaria, N. C. Rumin, J. F. Hayes and V. K. Agarwal, "Soft-Error Filtering: A Solution to the Reliability Problem of Future VLSI Digital Circuits", Proceedings of the IEEE, vol. 74, No. 5, pp. 669–683, May 1986.

S. M. Kang and D. Chu, "CMOS Circuit Design for Prevention of Single Event Upset", Proceedings of 1986 International Conference on Computer Design, Port Chester, New York, 1986.

S. Whitaker, J. Canaris and K. Liu, "SEU Hardened Memory Cells for a CCSDS Reed Solomon Encoder", IEEE Transactions on Nuclear Science, vol. 38, No. 6, pp. 1471–1477, Dec. 1991.

*Primary Examiner*—Edward P. Westin
*Assistant Examiner*—Andrew Sanders
*Attorney, Agent, or Firm*—Haverstock, Medlen & Carroll

[57] ABSTRACT

A complete logic family which is SEU immune is constructed, using logic/circuit design techniques, to recover from an SEU, regardless of the shape of the upsetting event. The logic family provides a redundancy of data to be used to restore data lost by an SEU. Two transistor networks are used, a p-channel network and an n-channel network. Each transistor network consists of a plurality of input transistors and a feedback transistor. The feedback transistor is sized to be weak compared to the input transistors. The transistor networks are designed to either resist an SEU or to shutdown until the SEU is over and then the network which is not shutdown will restore the data of the network that was hit by the SEU. The logic family can prevent glitch propagation from an upset node and can be implemented in a standard, commercial CMOS process without any additional processing steps. The logic family includes but is not limited to an Inverter, 2-input Nand, 2-input Nor, 3-input OrNand and a 3-input AndNor. The SEU recovery mechanism used by the logic family can be extended to logic structures in general. The SEU recovery mechanism is independent of the duration or shape of the upsetting event.

14 Claims, 8 Drawing Sheets

SINGLE EVENT UPSET IMMUNE LOGIC FAMILY

This invention was made with Government Support under Grant No. NAGW-1460 from the National Aeronautical and Space Administration, and the Government has certain rights in the invention.

FIELD OF THE INVENTION

The present invention relates to the field of single event upset immune circuits. More particularly, this invention relates to circuits which can recover from a single event upset and which can prevent glitch propagation from an upset node.

BACKGROUND OF THE INVENTION

Historically, the emphasis on Single Event Upset (SEU) research has been devoted exclusively to memory circuits. Memory circuits perform vital functions in any digital system, as program stores, temporary registers and as elements of state machines which control digital circuits. An SEU, or soft error, caused by a charged particle striking a diffusion region in a memory element can prove catastrophic to an electro-mechanical system which relies upon that memory element for communication or control.

Great effort has been made to find memory structures which are immune to SEUs, or at least mitigate the effects of an upsetting event. The design of SEU immune memories, whether RAM or Flip-Flops, has tended to ignore system level problems, such as an SEU of a combinational logic gate which is sampled by a memory circuit, or an upset of a control signal such as a clock line or mux select.

It has been shown that transients propagated out or into memory elements from logic circuits is indeed a real problem. Research, to find general logic gate structures which are SEU immune, has been primarily limited to resistive or capacitive hardening, which are basically low pass filtering approaches. A logic/circuit design approach has been presented by S. Kang and D. Chu in "CMOS Circuit Design for Prevention of Single Event Upset", Department of Electrical and Computer Engineering, University of Illinois at Urbana-Champaign, 1986. The CMOS inverter buffers presented by Kang and Chu however, are susceptible to particle hits on the p-type diffusion. The pre-charged output node is susceptible to a particle strike on the n-type diffusion if the pulldown chain does not evaluate low.

It is an object of the present invention to provide a logic family which will be immune to single event upsets. It is a second object of the present invention to maintain a source of uncorrupted data, which can be used to restore the lost data to its original value after an SEU.

SUMMARY OF THE INVENTION

A complete logic family which is SEU immune is constructed, using logic/circuit design techniques, to recover from an SEU, regardless of the shape of the upsetting event. The logic family provides a redundancy of data to be used to restore data lost by an SEU. Two transistor networks are used, a p-channel network and an n-channel network. Each transistor network consists of a plurality of logic transistors and a load transistor. The load transistor is sized to be weak compared to the logic transistors. The complimentary transistor networks are designed to either resist an SEU or be restored by the complementary circuit. The logic family can prevent glitch propagation from an upset node and can be implemented in a standard, commercial CMOS process without any additional processing steps. The logic family includes but is not limited to an Inverter, 2-input Nand, 2-input Nor, 3-input OrNand and a 3-input AndNor. The SEU recovery mechanism used by the logic family can be extended to logic structures in general. The SEU recovery mechanism is independent of the duration or shape of the upsetting event.

DETAILED DESCRIPTION OF THE PREFERRED EMBODIMENT

Figure 1:
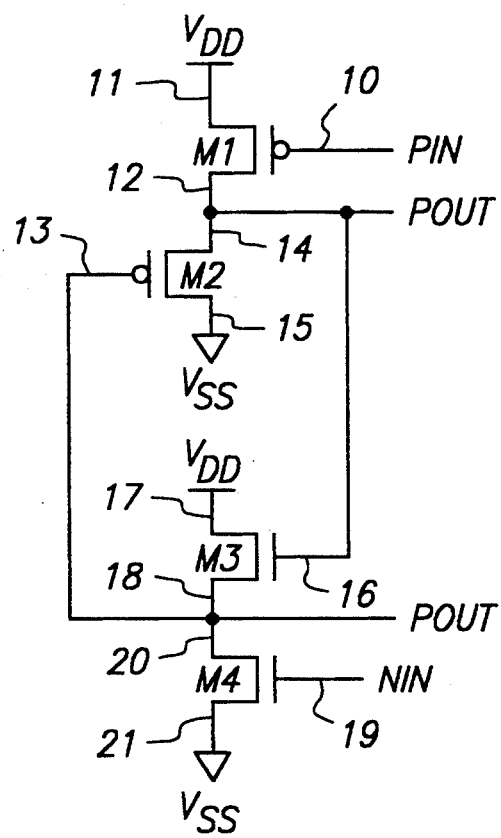
FIG. 1 illustrates a transistor level logic diagram of an SEU immune inverter.

FIG. 1 illustrates a transistor level logic diagram of an SEU immune inverter according to the preferred embodiment of the present invention. The inverter consists of two transistor networks, a p-channel network and an n-channel network. The p-channel network is comprised of the transistors M1 and M2 and the n-channel network is comprised of the transistors M3 and M4.

A p-channel input PIN is coupled to the gate 10 of the transistor M1 to control the transistor M1. The drain 11 of the transistor is coupled to the power supply VDD. The drain 14 of the transistor M2 is coupled to the source 12 of the transistor M1 and also to the output POUT. The source 15 of the transistor M2 is coupled to the ground VSS.

An n-channel input NIN is coupled to the gate 19 of the transistor M4 to control the transistor M4. The source 21 of the transistor M4 is coupled to the ground VSS. The source 18 of the transistor M3 is coupled to the drain 20 of the transistor M4, the gate 13 of the transistor M2 and the output NOUT. The gate 16 of the transistor M3 is coupled to the source 12 of the transistor M1, the drain 14 of the transistor M2 and the output POUT. The drain 17 of the transistor M3 is coupled to the power supply VDD.

The p-channel and n-channel networks are cross coupled. In particular, the n-channel output NOUT is coupled to control the gate 13 of the p-channel load transistor M2. Also, the p-channel output POUT is coupled to control the gate 16 of the n-channel load transistor M3. The load transistors M2 and M3 are sized to be weak in comparison to the logic transistors M1 and M4.

All devices used in the preferred embodiment of the present invention are enhancement mode transistors. The logic family according to present invention will operate with any type of transistor including enhancement, depletion or native MOS. The inverter of the present invention is a two input/two output logic device with the input PIN driving only p-channel devices and the input NIN driving only n-channel devices. The output node POUT can provide a source of logic "1"'s which cannot be upset and the output node NOUT provides a source of logic "0"'s which cannot be upset. The transistor M2 is sized to be weak compared to the transistor M1 and the transistor M3 is sized to be weak compared to the transistor M4.

When the inputs to the inverter are a logic "0", the outputs POUT and NOUT are at a logic "1". In this state only the output NOUT can be corrupted by an upset. If the output NOUT is hit, driving the node to a logic "0", the transistor M2 will turn on but cannot overdrive the transistor MI. The output POUT will remain at a logic "1", the transistor M3 will remain on, pulling the output NOUT back up to a logic "1". Conversely, if the inputs PIN and NIN are a logic "1", the outputs POUT and NOUT will be at a logic "0" and only the output POUT can be upset. If the output POUT is hit, driving the node to a logic "1", the transistor M3 will turn on but because it is weak compared to the transistor M4, the output NOUT will remain pulled down to a logic "0".

Figure 2:
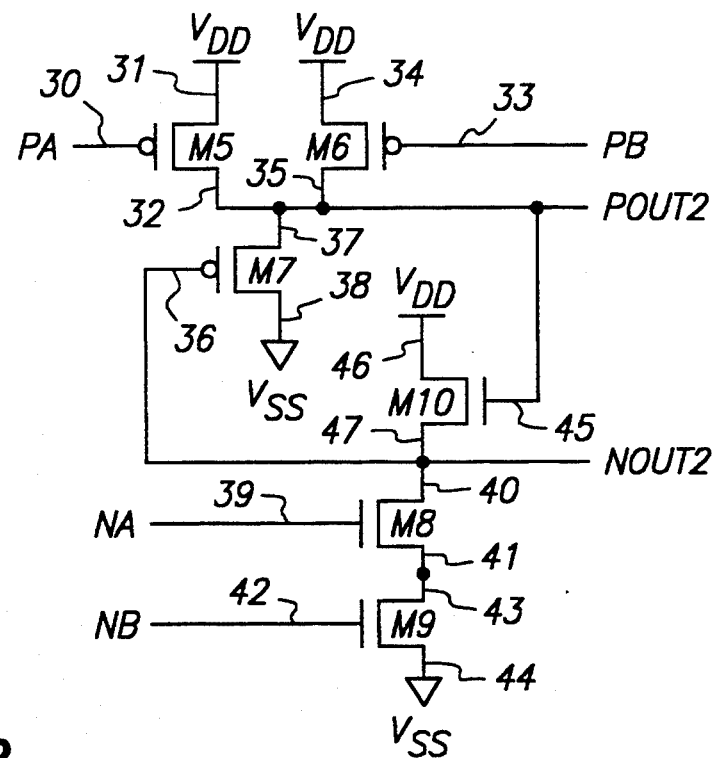
FIG. 2 illustrates a transistor level logic diagram of an SEU immune two-input NAND gate.

FIG. 2 illustrates a logic level diagram for a two-input NAND gate that is also immune to single event upsets. This logic circuit also consists of two transistor networks, a p-channel network and an n-channel network. A first p-channel input PA is coupled transistors.

The operation of the two-input NAND gate corresponds to the operation of the inverter described above. The inputs PA and PB drive only the p-channel devices and the inputs NA and NB drive only the n-channel devices. The output node POUT2 provides a source of logic "1"'s which cannot be upset and the output node NOUT2 provides a source of logic "0"'s which cannot be upset. The transistor M7 is sized to be weak compared to the transistors M5 and M6 and the transistor M10 is sized to be weak compared to the transistors M8 and M9.

When both of the inputs to the NAND gate are anything but two logic "1"s, the outputs POUT2 and NOUT2 are at a logic "1". In this state, only the output NOUT2 can be corrupted by an upset. If the output NOUT is hit by an SEU, driving the node to a logic "0", the transistor M7, because it is relatively weaker, will turn on but cannot overdrive the transistors M5 and M6. The output POUT2 will remain at a logic "1" and, the transistor M10 will remain on, pulling the output NOUT back up to a logic "1".

If both inputs are at a logic "1", the outputs POUT2 and NOUT2 will be at a logic "0" and only the output POUT2 can be upset. If the output POUT2 is hit by an SEU, driving the node to a logic "1", the transistor M10 will turn on, but because it is weak compared to the transistors M8 and M9, the output NOUT2 will remain at a logic "0", the transistor M7 will remain on, pulling the output POUT2 back up to a logic "1".

Figure 3:
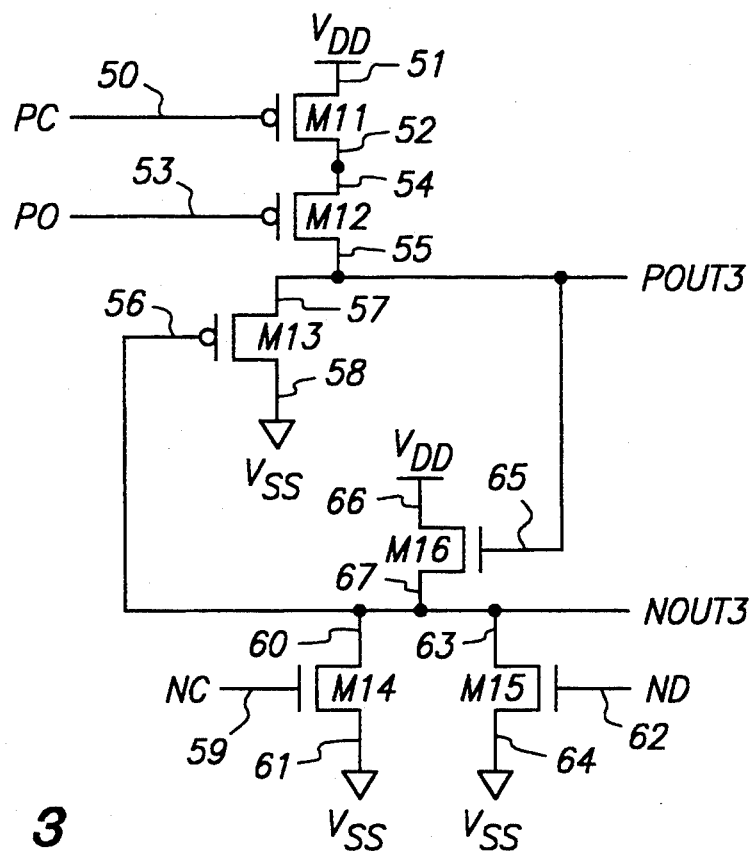
FIG. 3 illustrates a transistor level logic diagram of an SEU immune two-input NOR gate.
Figure 4:
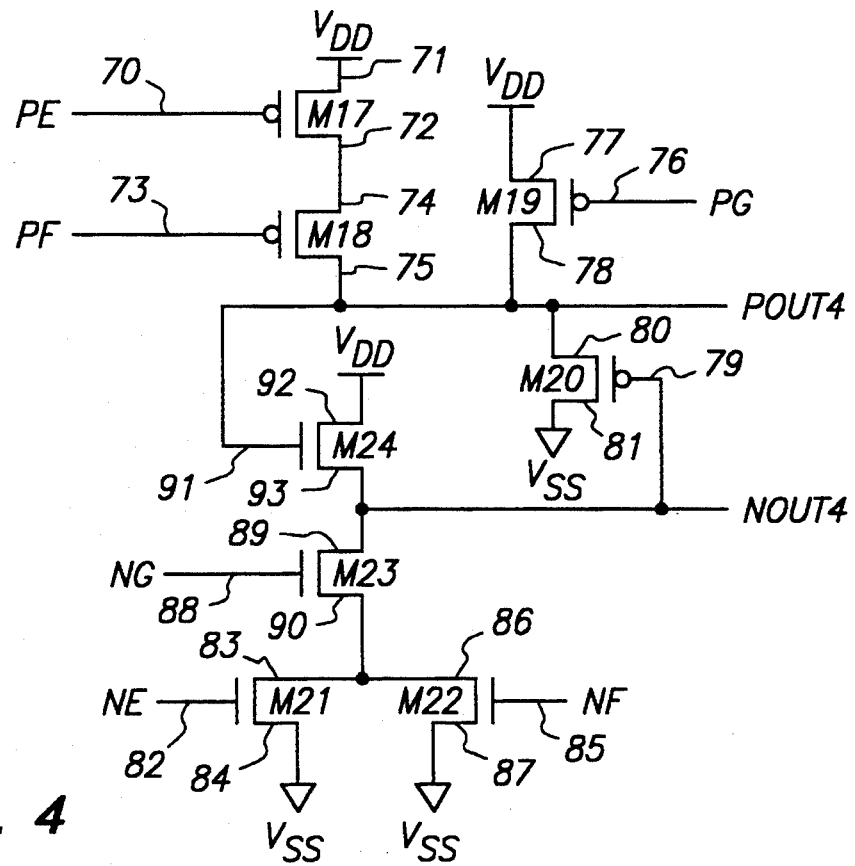
FIG. 4 illustrates a transistor level logic diagram of an SEU immune three-input OrNand gate.
Figure 5:
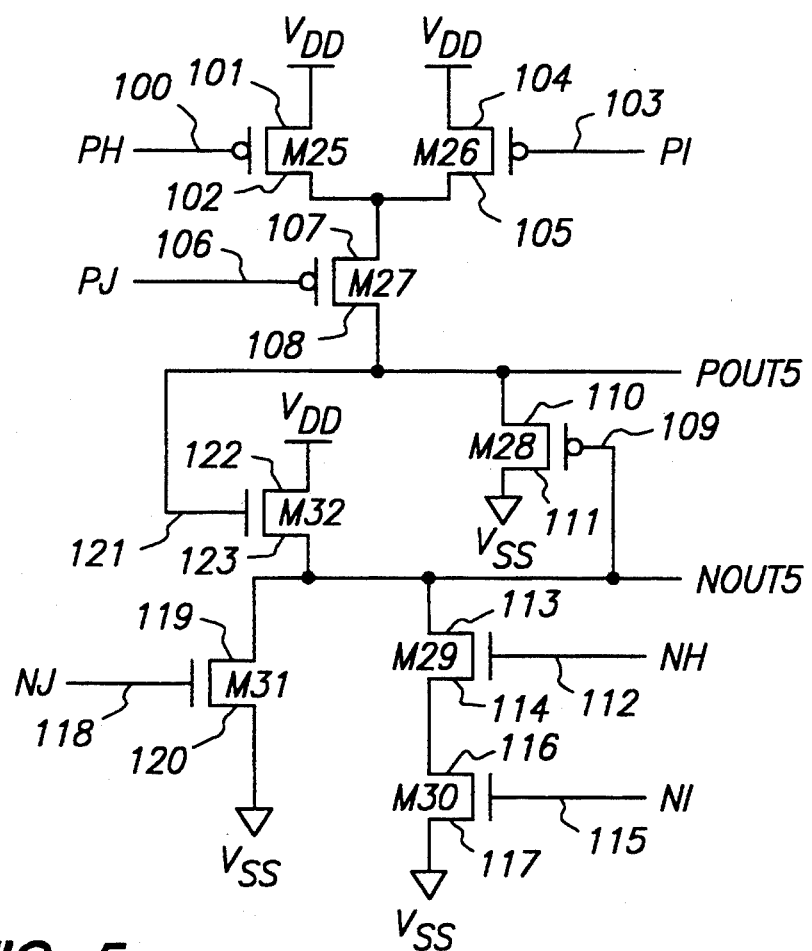
FIG. 5 illustrates a transistor level logic diagram of an SEU immune three-input AndNor gate.

The inverter design concepts explained above can be applied to any logic gate to provide SEU immunity. FIGS. 3, 4 and 5 illustrate transistor level logic the gate 30 of the transistor M5 for controlling the transistor M5. A second p-channel input PB is coupled to the gate 33 of the transistor M6 for controlling the transistor M6. Both of the drains 31,34 of the transistors M5 and M6 are coupled to the power supply VDD and both of the sources 32,35 of the transistors M5 and M6 are coupled together and also to the output POUT2. The source 38 of the transistor M7 is coupled to the ground VSS and the drain 37 of the transistor M7 is coupled to the sources 32,35 of the transistors M5 and M6 and also to the output POUT2.

A first n-channel input NA is coupled to the gate 39 of the transistor M8 for controlling the transistor M8 and a second n-channel input NB is coupled to the gate 42 of the transistor M9 for controlling the transistor M9. The source 44 of the transistor M9 is coupled to the ground VSS. The source 41 of the transistor M8 is coupled to the drain 43 of the transistor M9 and the drain 40 of the transistor M8 is coupled to the gate 36 of the transistor M7, the source 47 of the transistor M10 and the output NOUT2. The drain 46 of the transistor M10 is coupled to the power supply VDD. The gate 45 of the transistor M10 is coupled to the sources 32,35 and the drain 37 of the transistors M5, M6 and M7 respectively and also to the output POUT2.

As in FIG. 1, the p-channel and n-channel networks are cross-coupled. In particular, the n-channel output NOUT2 is coupled to control the gate 36 of the p-channel load transistor M7. Also, the p-channel output POUT2 is coupled to control the gate 45 of the n-channel load transistor M10. Corresponding to the circuit of FIG. 1, the load transistors M7 and M10 are sized to be weak in comparison to the logic diagrams of a two-input NOR, three-input OrNand and three-input AndNor, respectively. These circuits were designed using the same principles discussed above for the inverter and the two-input NAND gate.

FIG. 3 shows an SEU immune NOR circuit. In a p-channel network, a first p-channel input PC is coupled to the gate 50 of a first p-channel logic transistor M11. The drain 51 of the transistor M11 is coupled to the voltage supply VDD. The source 52 of the transistor M11 is coupled to the drain 54 of a second p-channel logic transistor M12. A second input PD is coupled to the gate 53 of the transistor M12. The source of the transistor M12 is coupled to the output POUT3. The drain 57 of a p-channel load transistor M13 is coupled to the p-channel output POUT3. The source 58 of the transistor M13 is coupled to the ground supply VSS.

In an n-channel network, a first n-channel input NC is coupled to the gate 59 of a first n-channel transistor M14 and a second n-channel input ND is coupled to the gate 62 of a second n-channel transistor M15. The sources 61 and 64, respectively, of the transistors M14 and M15 are coupled to the ground VSS. The drains 60 and 63, respectively, of the transistors M14 and M15 are coupled to an n-channel output NOUT3. The drain of a third n-channel transistor M16 is coupled to the supply voltage VDD. The source of the transistor M16 is coupled to the n-channel output NOUT3.

The p-channel and n-channel networks are cross coupled. In particular, the n-channel output NOUT3 is coupled to control the gate 56 of the p-channel load transistor M13. Also, the p-channel output POUT3 is coupled to control the gate 65 of the n-channel load transistor M16. Corresponding to the circuits of FIGS. 1 and 2, the load transistors M13 and M16 are sized to be weak in comparison to the logic transistors.

FIG. 4 shows a three input SEU immune ORNand, i.e., the output will be when low when either one or both of the E and F inputs are high AND the G input is high. In a p-channel network, a first p-channel input PE is coupled to the gate 70 of first p-channel logic transistor M17. The drain 71 of the transistor M17 is coupled to the supply voltage VDD and the source 72 of the transistor M17 is coupled to the drain 74 of a second p-channel logic transistor M18. A second p-channel input PF is coupled to the gate 73 of the transistor M18 and the source of the transistor M18 is coupled to a p-channel output POUT4. A third p-channel input PG is coupled to the gate 76 of a third p-channel logic transistor M19. The drain 77 of the transistor M19 is coupled to the supply VDD and the source 78 of the transistor M19 is coupled to the p-channel output POUT4. The drain 80 of a p-channel load transistor M20 is coupled to the p-channel output POUT4. The source 81 of the transistor M20 is coupled to the ground supply VSS.

In a complementary n-channel network, a first n-channel input NE is coupled to the gate 82 of an n-channel logic transistor M21. A second n-channel input NF is coupled to the gate 85 of a second n-channel logic transistor M22. The drains 83 and 86, respectively, of the transistors M21 and M22 are coupled to one another. The sources 84 and 87, respectively, of the transistors M21 and M22 are coupled to ground VSS. A third n-channel input NG is coupled to the gate 88 of a third n-channel logic transistor M23. The drain 89 of the transistor M23 is coupled to an n-channel output NOUT4. The source 90 of the transistor M23 is coupled to the drains 83 and 86, respectively, of the transistors M21 and M22.

These p-channel and n-channel networks are also cross coupled. In particular, the n-channel output NOUT4 is coupled to control the gate 79 of the p-channel load transistor M20. Also, the p-channel output POUT4 is coupled to control the gate 91 of the n-channel load transistor M24. Corresponding to the circuits of FIGS. 1, 2 and 3, the load transistors M20 and M24 are sized to be weak in comparison to their respective logic transistors.

FIG. 5 shows a three input AndNor circuit, i.e., the output will be low when either both inputs H and I are high and/or input J is high. In a p-channel network, a first p-channel input PH is coupled to the gate 100 of a first p-channel logic transistor M25 and a second p-channel input PI is coupled to the gate 103 of a second p-channel logic transistor M26. The drains 101 and 104, respectively, of the transistors M25 and M26 are coupled to the supply voltage VDD. The sources 102 and 105, respectively, of the transistors M25 and M26 are coupled to one another. A third p-channel input PJ is coupled to the gate of a third p-channel logic transistor M27. The drain 107 of the transistor M27 is coupled to the drains 102 and 105, respectively, of the transistors M25 and M26. The source 108 of the transistor M27 is coupled to the p-channel output POUT5. The drain 110 of a p-channel load transistor M28 is coupled to the p-channel output POUT5 and the source of the transistor M28 is coupled to the ground supply VSS.

In an n-channel network, a first n-channel input NH is coupled to the gate 112 of a first n-channel logic transistor M29. The drain 113 of the transistor M29 is coupled to the n-channel output NOUT5. The source 114 of the transistor M29 is coupled to the drain 116 of a second n-channel logic transistor M30. A second n-channel input NI is coupled to the gate 115 of the transistor M30. The source 117 of the transistor M30 is coupled to ground VSS. A third n-channel input NJ is coupled to the gate 118 of a third n-channel logic transistor M31. The drain 119 of the transistor M31 is coupled to the n-channel output NOUT5. The source 120 of the transistor M31 is coupled to ground VSS. The drain 122 of an n-channel load transistor M32 is coupled to the supply VDD. The source of the transistor M32 is coupled to the n-channel output NOUT5.

These p-channel and n-channel networks are also cross coupled. In particular, the n-channel output NOUT5 is coupled to control the gate 109 of the p-channel load transistor M28. Also, the p-channel output POUT5 is coupled to control the gate 121 of the n-channel load transistor M32. Similar to the circuits of FIGS. 1, 2, 3 and 4, the load transistors M28 and M32 are sized to be weak in comparison to their respective logic transistors.

In general, an SEU immune logic gate, implemented with this technique, requires 2n+2 transistors, n being the number of gate inputs. In comparison, classical CMOS design requires 2n transistors to implement a gate.

The logic family described here can provide transient suppression of an upset event as well as recovery from the upset. Networks of logic gates are connected such that the p-channel output POUT is only driven by p-channel devices and the n-channel output NOUT is only driven by n-channel devices. If the p-channel output is upset at a time that it should be a "0", driving the node to a logic "1", the p-transistor being driven will be turned off momentarily without affecting the output which drives the following stage. If the output NOUT is upset at a time that it should be a "1", driving the node to a logic "0", the n-transistor being driven will be turned off momentarily without affecting the output which drives the following stage.

The above description obviously overlooks some of the circuit design issues which would be faced by someone wishing to design with this logic family. The family, although implemented in a CMOS process uses a ratio of transistor strength between the strengths of the transistors controlling the logic transistors and the load transistors. Additionally, threshold voltages become a design issue because of the use of enhancement mode transistors as the circuit loads to pullup the n-channel output and to pulldown the p-channel output.

Figure 6:
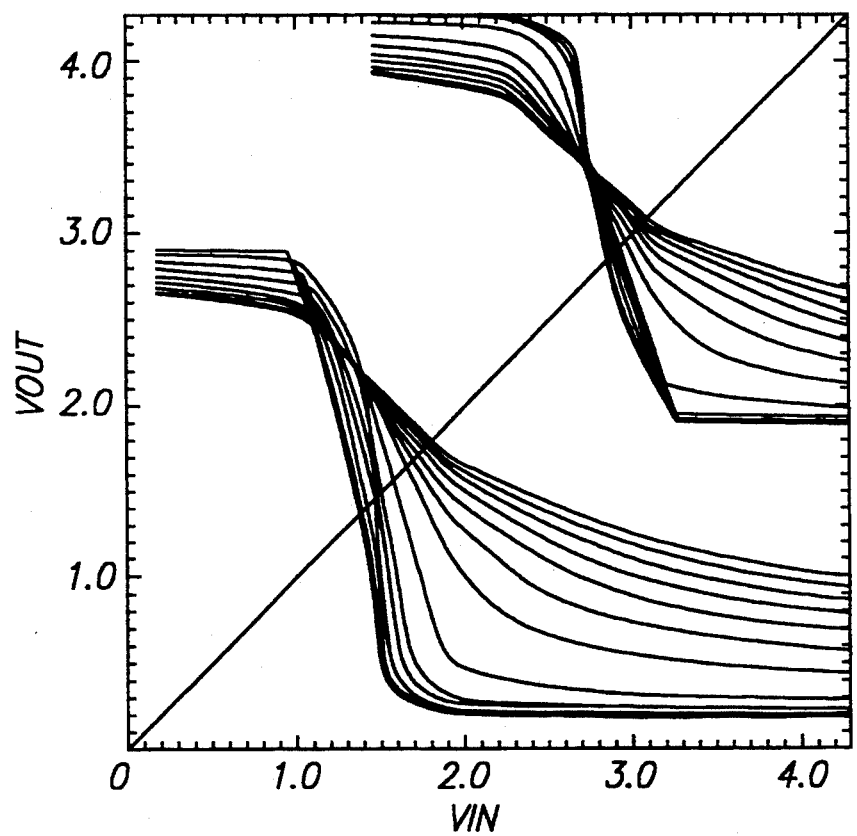
FIG. 6 illustrates a DC transfer function plot produced by a SPICE simulation of the SEU immune inverter.

The DC transfer function, $$\frac{V_{out}}{V_{in}}$$

of an inverter provides several useful pieces of information about the logic family. Noise margin, inverter gain and inverter switch points are all characteristics which can be determined from a plot of $V_{out}$ versus $V_{in}$. A DC transfer function plot can also show if hysteresis is present. A SPICE circuit simulation for the SEU immune inverter was used to generate DC transfer functions one of which is illustrated in FIG. 6.

In a classical family of logic, such as NMOS, PMOS or CMOS, a transistor gain $\beta$ is defined to be the product of the process gain factor, $K'$, and the transistor aspect ratio W/L. That is $$\beta_{TRAN} = K'\left(\frac{W}{L}\right)$$

The inverter $\beta$ is defined as the ratio of the pullup $\beta$ and the pulldown $\beta$, or $$\beta_{INV} = \frac{\beta_{PU}}{\beta_{PD}}$$

The logic family of the present invention is a ratioed logic family. In this case the ratioing occurs between the same type devices, and the K' term cancels in $\beta_{TRAN}$. Therefore, $$\beta_{TRAN} = \frac{W}{L}$$

In this case it is more useful to define the transistors as strong (M1,M4) and weak (M2,M3), instead of the traditional pullup and pulldown. To complicate matters further, $\beta_{INV}$ now has two components, $\beta_N$ and $\beta_P$ which are not necessarily equal. For the simulations presented here, $$\beta_{INV} = \beta_N = \beta_P = \frac{\beta_{STRONG}}{\beta_{WEAK}}$$

Because "weak" is a relative term and it was unknown what effect ratioing would have on DC characteristics, simulations were run over 16 process parameter/voltage/temperature cases on 15 values of $\beta_{INV}$ ranging from ⅛ to 8/1. Table 1 lists the 16 simulation cases. It was necessary to run these 16 cases in order to determine what effect processing variations would have on the SEU immune inverter. The temperature and voltage ranges cover those required by military specifications for integrated circuits.

TABLE 1

16 SIMULATION CASES

| NAME | PARAMETER SET | VOLTAGE RANGE | TEMP. |
|---|---|---|---|
| WCLVHT | SLOW N SLOW P | 4.1V | 140° C. |
| WCHVHT | SLOW N SLOW P | 5.5V | 140° C. |
| WCLVLT | SLOW N SLOW P | 4.1V | −55° C. |
| WCHVLT | SLOW N SLOW P | 5.5V | −55° C. |
| BCLVHT | FAST N FAST P | 4.1V | 140° C. |
| BCHVHT | FAST N FAST P | 5.5V | 140° C. |
| BCLVLT | FAST N FAST P | 4.1V | −55° C. |
| BCHVLT | FAST N FAST P | 5.5V | −55° C. |
| FNSPHVHT | FAST N SLOW P | 4.1V | 140° C. |
| FNSPHVHT | FAST N SLOW P | 5.5V | 140° C. |
| FNSPLVLT | FAST N SLOW P | 4.1V | −55° C. |
| FNSPHVLT | FAST N SLOW P | 5.5V | −55° C. |
| SNFPLVHT | SLOW N FAST P | 4.1V | 140° C. |
| SNFPHVHT | SLOW N FAST P | 5.5V | 140° C. |
| SNFPLVLT | SLOW N FAST P | 4.1V | −55° C. |
| SNFPHVLT | SLOW N FAST P | 5.5V | −55° C. |

FIG. 6 illustrates a plot of a typical transfer function produced by the SPICE simulations, in this case the WCLVLT simulation. All 15 values of $\beta_{INV}$ are plotted. This plot is obviously different from a common inverter DC transfer function. First, there are two sets of curves. The lower set of curves are illustrative of the n-channel output NOUT, the upper set of the p-channel output POUT. Secondly, the output NOUT curves do not roll off smoothly and the output POUT curves do not transition smoothly to the lowest values of the output voltage $V_{out}$. These flat portions of the curves are caused by threshold voltage drops across the transistors M2 and M3 respectively. The curves with shallower slopes in the transition region are those of the inverters with $\beta_{INV}$ less than 1. Due to threshold voltage effects, the output POUT will not pull down to the ground VSS and the output NOUT will not pull up to the power supply VDD. This causes either the transistor M2 or the transistor M3 to be slightly on. This creates a problem with gain and noise margins in those inverters with small $\beta_{INV}$.

Once the DC simulations were performed, an inverter gain and noise margin analysis was undertaken. It is known that ratioed CMOS logic, particularly when threshold voltage effects are involved, has lower noise margins than non-ratioed CMOS logic. Ratioing will also have an effect on the gain of a logic gate. If the gain of the logic gate is too low a signal will die out after only a few logic stages. In the case of the SEU immune inverter of the present invention, under the WCLVLT case, gains of 1 or less were attained for a $\beta_{INV}$ of ⅛ and 1/7. Additionally, negative noise margins were attained for a $\beta_{INV}$ of 1/6, 1/5 and ¼. These $\beta$s are of course unusable in a design. Both noise margin low (immunity from positive spikes) and noise margin high (immunity from negative spikes) were analyzed for the outputs POUT and NOUT. Table 2 provides a summary of this analysis.

TABLE 2

SUMMARY OF NOISE MARGIN ANALYSIS

| | NOISE MARGIN LOW | | |
|---|---|---|---|
| LOW | 0.20V | $\beta_{INV} = \frac{1}{1}$ | BCHVHT |
| HIGH | 0.74V | $\beta_{INV} = \frac{1}{2}$ | FNSPHVLT |
| | NOISE MARGIN HIGH | | |
| LOW | 0.30V | $\beta_{INV} = \frac{1}{2}$ | SNFPLVHT |
| HIGH | 1.07V | $\beta_{INV} = \frac{1}{1}$ | WCLVLT |
| | INVERTER GAIN VARIATIONS | | |
| LOW | 1.6 | | |
| HIGH | 11.3 | | |

The inverter DC simulations helped to eliminate five values of $\beta_{INV}$ from further consideration and showed that several more could prove marginal in a design. The SEU recovery ability was investigated next.

To verify the SEU recovery ability and the transient suppression characteristics of the SEU immune inverter of the present invention, SPICE simulations were run over the same 16 cases listed in Table 1. Both of the outputs POUT and NOUT were tested. Since inverters with values of $\beta_{INV}$ less than ⅛ where rejected during the DC analysis above only ten values of $\beta_{INV}$, ranging from ⅛ to 8/1, were simulated at this stage. The SEU immunity characteristics of the logic family were shown to be independent of processing parameters, temperature or supply voltage. The error recovery mechanism is provided by the logical feedback of the transistors M2 and M3 and the ratioing of the transistor strengths. The recovery mechanism is also not dependent upon the wave shape of the current pulse which upsets the node.

Figure 7:
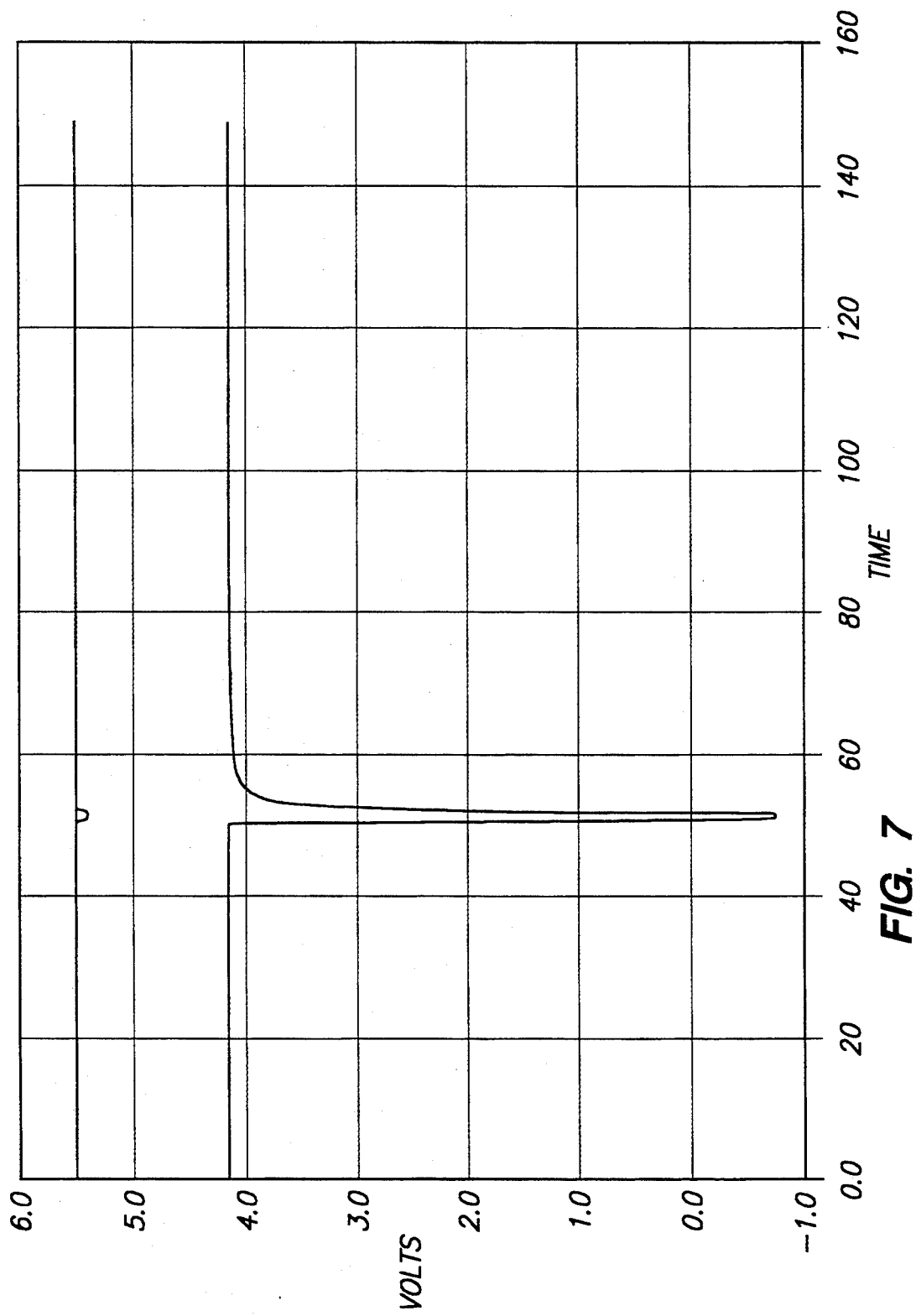
FIG. 7 illustrates recovery results for the output node NOUT of the SEU immune inverter.
Figure 8:
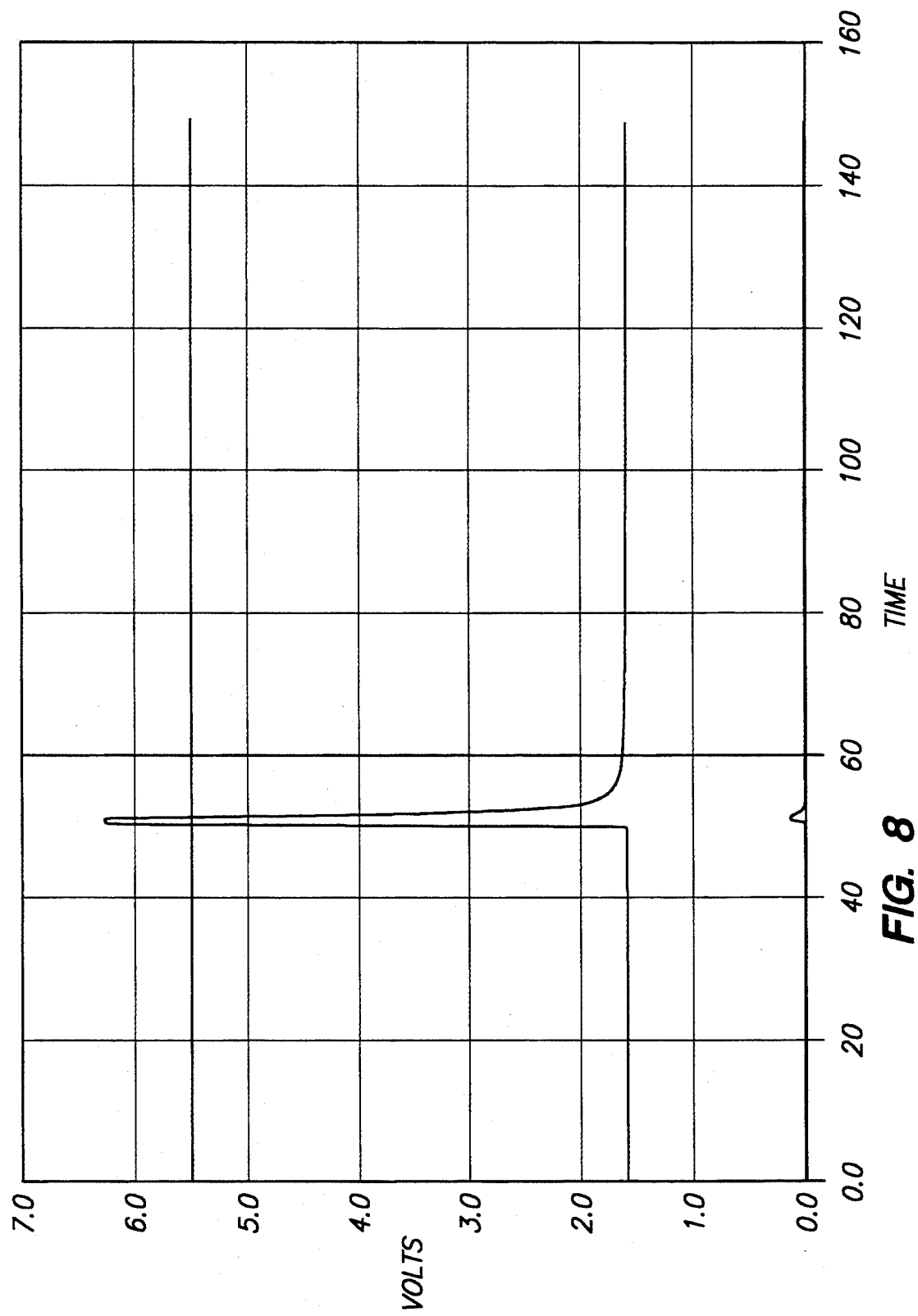
FIG. 8 illustrates recovery results for the output node POUT of the SEU immune inverter.

The simulation circuit used to test the recovery mechanism of the present invention consisted of a chain of 3 identical inverters. No parasitic capacitance other than self-capacitance and that seen at the inputs to the next stage was added to the circuit. The inputs to the first inverter were set up to the proper initial conditions. A voltage controlled current source was connected to the node to be upset in order to provide a means to inject charge into the node without attaching any parasitic capacitance. Additionally, an ideal diode, emulating the parameter dependent source/drain to substrate/well diodes, was attached to the node. This diode did not create any additional capacitance. A current pulse, with a duration of 10 ns, and a magnitude sufficient to forward bias the source/drain diode, was applied to the node. The 10 ns pulse width was chosen because it was longer than the propagation delay through the inverter as well as being longer than a real SEU. Recovery from an SEU was shown to be independent of parameter/voltage/temperature cases. Although all of the $\beta_{INV}$ cases recovered, SEU recovery time was dependent upon the value of $\beta_{INV}$. Faster recovery times were noted from values of $\beta_{INV}$ greater than 1/1. FIGS. 7 and 8 illustrate typical recovery results for the output nodes NOUT and POUT respectively.

Besides being able to recover from an upset event an SEU immune logic family must also be able to suppress the propagation of transients out of the upset node. Due to the P-net driving P-net and N-net driving N-net configuration described for the SEU immune inverter above, the logic family of the present invention is able to suppress glitches caused by an SEU as verified by SPICE simulations. The simulation circuit used to test transient suppression was the same as that used for testing upset recovery. In the case of transient suppression, however, a 1 ns current pulse was applied to the upset node. This pulse duration is closer to what one would expect from a real SEU. Transient suppression was measured at the output of the inverter being driven by the upset node. If the magnitude of the glitch on this output was within the noise margin, for the parameter/voltage/temperature case and the value of $\beta_{INV}$ being simulated, the transient was considered suppressed. Results of these simulations indicated that transient suppression was dependent upon simulation cases as well as the value of $\beta_{INV}$. In fact, any value of $\beta_{INV}$ less than or equal to 1/1 was rejected as unusable in a design due to the poor transient suppression abilities of the circuit for those values.

The seven ratios with values of $\beta_{INV}$ greater than one remaining after the SEU recovery/transient suppression simulations were subjected to a transient analysis to determine switching speeds of the SEU immune logic family of the present invention. With a modern CMOS process it is possible to attain inverter gate delays of 1 ns or less. For an SEU immune logic family to be of interest to the VLSI design community the inverter of the present invention should have a gate delay at least in the nanosecond range. The transient analysis simulations show that this is possible with the SEU immune logic family of the present invention. SPICE simulations were run over the same 16 cases listed in Table 1. The simulation circuit used for these simulations was a chain of 7 identical inverters. Each inverter was loaded with a 1000 pF linear capacitor. This large capacitor swamped out any voltage dependent capacitors associated with the transistor source/drain regions as well as gate capacitances seen by the inverter outputs. The first inverter in the chain was excited by a step function, and pair delay information was extracted from the output. A pair delay is defined to be the delay, measuring from mid-point to mid-point of the voltage swing, through a pair of inverters. This delay contains both a time delay rise and a time delay fall.

In non-ratioed logic, such as classical CMOS, inverters are designed to have equal rise and fall times. In a ratioed logic family, such as that used in the present invention, it is not always possible to design for equal rise and fall times, therefore pair delay information is more useful. In this case four pair delay values were computed, delay from a rising edge and from a falling edge, for both of the outputs NOUT and POUT. The longest delay of these was chosen as the worst case delay.

At the outset it was unknown which parameter/voltage/temperature case would have the worst case speed. In classical CMOS it would be WCLVHT. For this logic family it also proved to be WCLVHT. Simulations were run on all of the surviving values of $\beta_{INV}$, with ten different transistor widths, ranging from 2.4 $\mu$m to 24.0 $\mu$m.

Pair delay charts for each surviving value of $\beta_{INV}$ were constructed. A table of pair delay versus transistor width is provided in Table 3. As expected, because delay is inversely proportional to width, pair delays decrease as a function of transistor width. The speed of the inverter can also be calculated from Table 3, because speed has a reciprocal relationship to delay, it follows that the lower the delay time, the faster the inverter.

TABLE 3

Pair delay Chart
Pairdelay Chart ($C_{load}$ = 1000pF, Delay = $\mu$s)

| $\beta_{INV}$ | FeedBack Transitor Width (L = 1.0 $\mu$m) | | | | | | | | | |
|---|---|---|---|---|---|---|---|---|---|---|
| | 2.4 $\mu$m | 4.8 $\mu$m | 7.2 $\mu$m | 9.6 $\mu$m | 12.0 $\mu$m | 14.4 $\mu$m | 16.8 $\mu$m | 19.2 $\mu$m | 21.6 $\mu$m | 24.0 $\mu$m |
| $\frac{2}{1}$ | 143 | 54 | 34 | 25 | 19 | 16 | 14 | 12 | 11 | 9 |
| $\frac{3}{1}$ | 107 | 41 | 26 | 19 | 15 | 12 | 10 | 9 | 8 | 8 |
| $\frac{4}{1}$ | 90 | 35 | 22 | 16 | 13 | 11 | 9 | 8 | 7 | 6 |
| $\frac{5}{1}$ | 82 | 32 | 20 | 15 | 12 | 9 | 8 | 7 | 7 | 6 |
| $\frac{6}{1}$ | 75 | 29 | 18 | 13 | 11 | 9 | 8 | 7 | 6 | 5 |
| $\frac{7}{1}$ | 70 | 27 | 17 | 12 | 10 | 8 | 7 | 6 | 5 | 5 |
| $\frac{8}{1}$ | 66 | 25 | 16 | 12 | 9 | 8 | 7 | 6 | 5 | 5 |

From the results of the SEU recovery ability, and the pair delay information, it would seem that a value of $\beta_{INV}$ equal to infinity would be the best choice. However, as in all engineering endeavors there is a practical limit to the choice of the value of $\beta_{INV}$. Both power dissipation and physical layout constraints must also be considered.

Due to the ratioing between the normal transistors and the feedback transistors, and the effects of threshold voltages, the logic family of the present invention dissipates static power. SPICE simulations were run, with the same cases listed in Table 1, to characterize this power dissipation, and the effects of different values of $\beta_{INV}$ on it. As expected, power dissipation increased with the value of $\beta_{INV}$. The worst power dissipation was found under the BCHVLT conditions for both input high and input low conditions. Static power consumption may place a limit on the number of SEU immune gates which can be integrated on an integrated circuit.

The SEU immune logic family of the present invention can be implemented in a standard CMOS process, using standard layout design rules familiar to one reasonably skilled in the art. The logic family does, however, have characteristics which makes physical layout of the family different than a classical CMOS layout. A classical inverter, for example, requires a minimum of two lines, the input and the output, crossing the well boundary. The SEU immune inverter has two separate outputs, POUT and NOUT, but they need not cross the well boundary. However, there are two feedback lines which must cross. Additionally, both VDD and VSS are required for both n-transistors and p-transistors used in the present invention, whereas a classical inverter only requires one power supply for each transistor type. The signal connections are more complicated in the SEU immune logic family than in classical CMOS. In addition, the SEU immune logic family of the present invention uses two more transistors than does classical CMOS. It should, therefore, be expected that layout densities would be less for the SEU immune logic family of the present invention.

Figure 9:
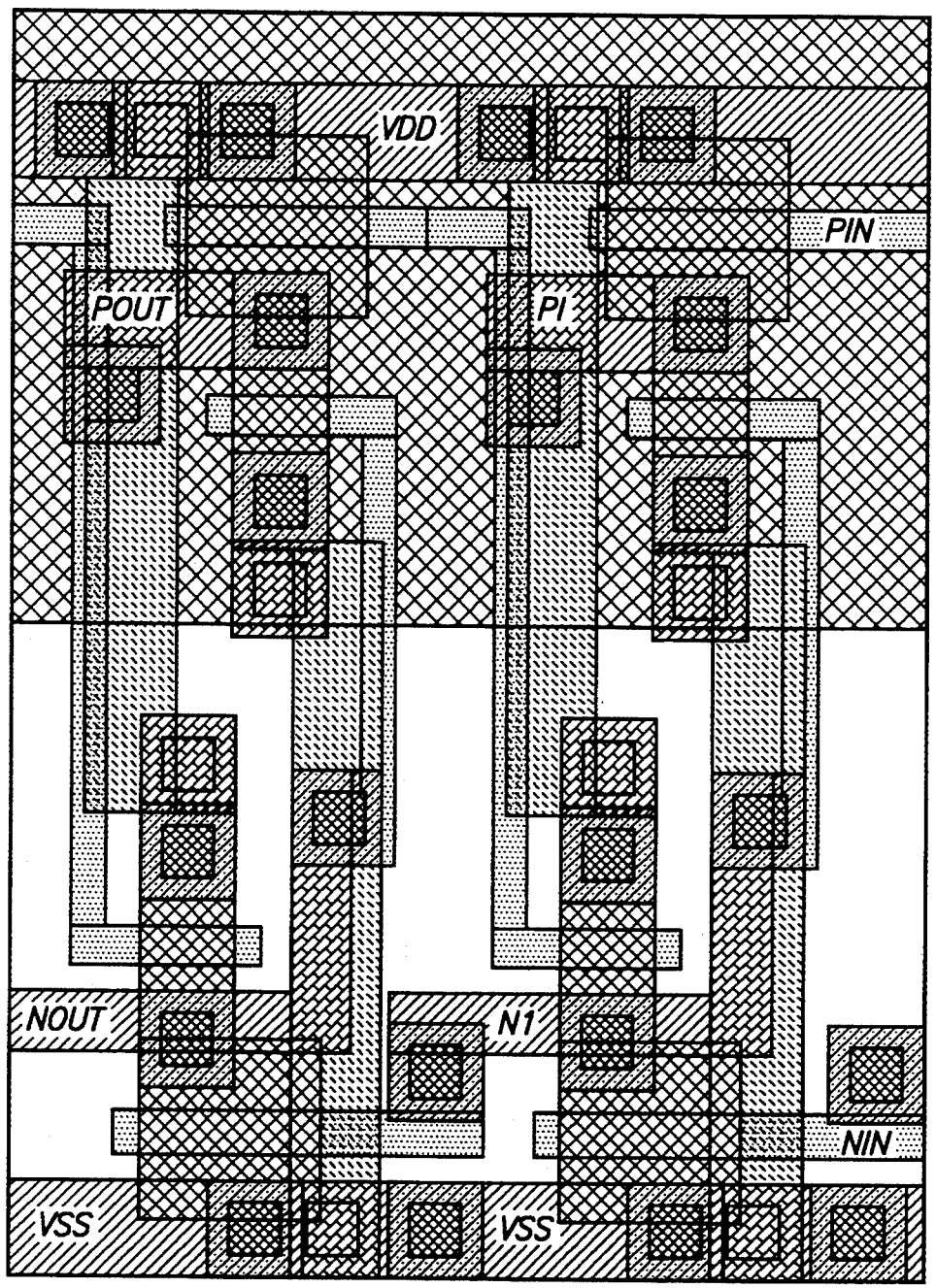
FIG. 9 illustrates a layout of a two inverter chain using SEU immune inverters.
Figure 10:
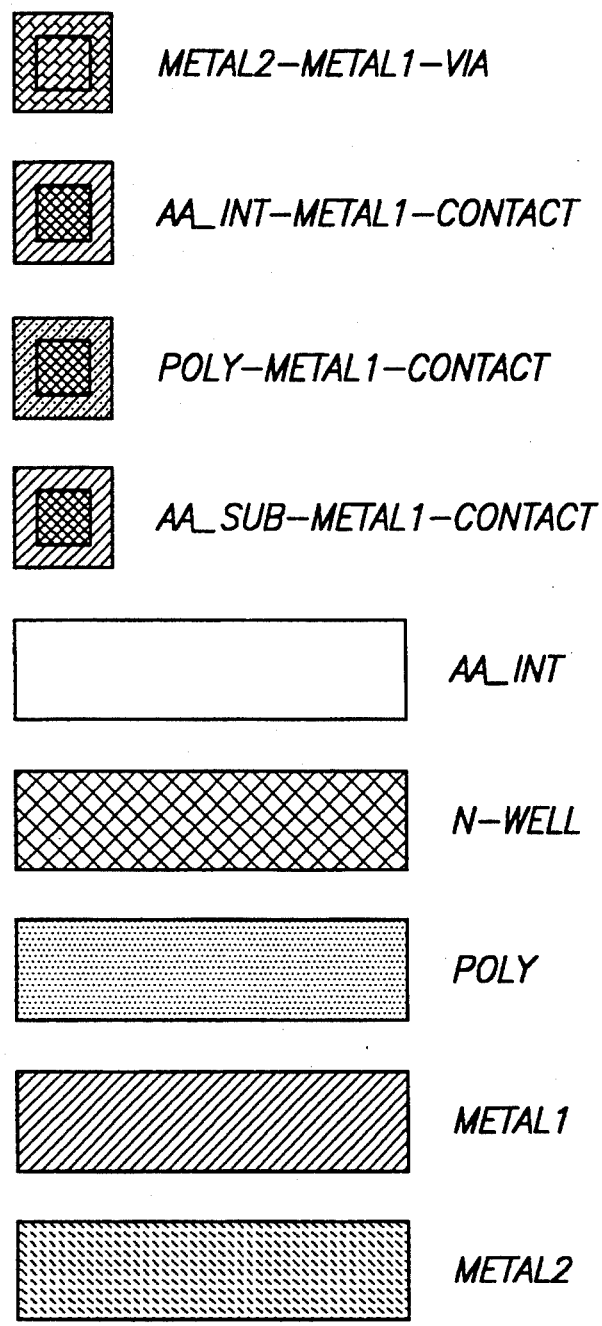
FIG. 10 is a key identifying the cross hatching of FIG. 9.

FIG. 9 is a layout of a two inverter chain and is one possible layout configuration for an SEU immune inverter. The cross-hatching to identify the individual layers is shown in FIG. 10. The inverter has a value of $\beta_{INV}$ equal to $\frac{1}{2}$. The feedback transistor widths used are 2.4 μm. This layout style is typical of what might be found in a standard cell library. The power buses are on the outside of the cell and can be easily widened. The horizontal layout allows transistor widths to increase without increasing the height of the cell. No room, however, has been provided to make external connections to the primary inputs or the inverter outputs. It should be noted that the layout is complicated by the necessity of routing VDD and VSS vertically to make connections to the feedback transistors. An alternative layout approach would be to provide both VDD and VSS at the top and bottom of the cell. This would alleviate the crossovers and should allow more room to make the external connections to the inputs and outputs.

Various modifications may be made to the preferred embodiment without departing from the spirit and scope of the invention as defined by the appended claims.

I claim:

1. A single event upset immune logic circuit having a plurality of inputs, a first output and a second output, comprising:

a. means for suppressing transient aspects of a single event upset; and
   b. means for coupling both the first output and the second output together using a first feedback path and a second feedback path for maintaining a source of uncorrupted data for use in restoring data that is lost in a single event upset wherein the logic circuit comprises 2n+2 transistors, where n is equal to the number of inputs to the circuit.

2. The apparatus as claimed in claim 1 wherein the single event upset immune logic circuit is implemented using a CMOS process.

3. The apparatus as claimed in claim 2 wherein the transistors are all enhancement mode MOSFET transistors.

4. A single event upset immune logic circuit comprising:

a. a first transistor network comprising a first plurality of transistors;
   b. a second transistor network coupled to the first transistor network, comprising a second plurality of transistors;
   c. a first plurality of inputs coupled to the first transistor network for driving only the first transistor network, the first network having a first output for providing a first logic state which cannot be upset;
   d. a second plurality of inputs coupled to the second transistor network for driving only the second transistor network, the second network having a second output for providing a second logic state which cannot be upset;
   e. means for restoring a first logic state destroyed in the second network by a single event upset comprising a first feedback path for coupling the first output to control the second network; and
   f. means for restoring a second logic state destroyed in the first network by a single event upset comprising a feedback path for coupling the second output to the first network.

5. The apparatus as claimed in claim 4 wherein a first load transistor in the first network is sized to be weak compared to one or more first logic transistors in the first network and a second load transistor in the second network is sized to be weak compared to one or more second logic transistors in the second network.

6. The apparatus as claimed in claim 4 wherein the logic circuit comprises 2n+2 transistors, where n is equal to the number of inputs in the circuit.

7. The apparatus as claimed in claim 4 wherein the single event upset immune logic circuit is implemented using a CMOS process.

8. A single event upset immune inverter having a first input, a second input, a first output and a second output, comprising:

a. a first transistor coupled to the first input for providing a source of a first logic state which cannot be upset;
   b. a second transistor coupled to the second input for providing a source of a second logic state which cannot be upset;
   c. a first output coupled to the first transistor;
   d. a second output having the same logic state value as the first output, unless either the first output or the second output have been hit by a single event upset, coupled to the second transistor; and
   e. means for coupling the first output to the second output to restore either the first output or the second output to the same logic state value as the first output or the second output if either the first output or the second output have been hit by a single event upset.

9. The apparatus as claimed in claim 8 wherein the first plurality of transistors comprises a first transistor and a second transistor, the second transistor sized to be weak compared to the first transistor and the second plurality of transistors comprises a third transistor and a fourth transistor, the fourth transistor sized to be weak compared to the third transistor.

10. The apparatus as claimed in claim 8 wherein the single event upset immune inverter is implemented using a CMOS process.

11. The apparatus as claimed in claim 8 wherein the means for coupling the first output to the second output is comprised of a first feedback path coupled to the first transistor and a second feedback path coupled to the second transistor.

12. The apparatus as claimed in claim 8 wherein the transistors of both the first plurality and the second plurality are enhancement mode MOSFET transistors.

13. A single event upset immune CMOS inverter having a first input and a second input and a first output and a second output, coupled to a power supply and ground comprising:
 a. a first p-channel transistor having a first gate, a first source and a first drain, the first gate coupled to the first input, the first drain coupled to the power supply and the first source coupled to the first output;
 b. a second p-channel transistor having a second gate, a second source and a second drain, the second gate coupled to the second output, the second source coupled to the ground and the second drain coupled to the first drain and the first output;
 c. a third n-channel transistor having a third gate, a third source and a third drain, the third gate coupled to the first source, the second drain and the first output, the third drain coupled to the power supply and the third source coupled to the second gate and the second output; and
 d. a fourth n-channel transistor having a fourth gate, a fourth source and a fourth drain, the fourth gate coupled to the second input, the fourth source coupled to the ground and the fourth drain coupled to the second gate, the third source and the second output.

14. A single event upset immune CMOS two-input NAND gate having a first input, a second input, a third input and a fourth input and a first output and a second output, coupled to a power supply and ground, comprising:
 a. a first p-channel transistor having a first gate, a first source and a first drain, the first gate coupled to the first input, the first drain coupled to the power supply and the first source coupled to the first output;
 b. a second p-channel transistor having a second gate, a second source and a second drain, the second gate coupled to the second input, the second drain coupled to the power supply and the second source coupled to the first source and to the first output;
 c. a third p-channel transistor having a third gate, a third source and a third drain, the third gate coupled to the second output, the third source coupled to the ground and the third drain coupled to the first source, the second source and the first output;
 d. a fourth n-channel transistor having a fourth gate, a fourth source and a fourth drain, the fourth gate coupled to the third input and the fourth drain coupled to the third gate and the second output;
 e. a fifth n-channel transistor having a fifth gate, a fifth source and a fifth drain, the fifth gate coupled to the fourth input, the fifth source coupled to the ground and the fifth drain coupled to the fourth source; and
 f. a sixth n-channel transistor having a sixth gate, a sixth source and a sixth drain, the sixth gate coupled to the first and second sources and to the third drain and the first output, the sixth drain coupled to the power supply and the sixth source coupled to the third gate, the fourth drain and the second output.

* * * * *